United States Patent
Bortscheller et al.

(10) Patent No.: US 6,890,234 B2
(45) Date of Patent: May 10, 2005

(54) LED CROSS-LINKABLE PHOSPHOR COATING

(75) Inventors: Jacob C. Bortscheller, Clifton Park, NY (US); Robert J. Wojnarowski, Ballston Lake, NY (US)

(73) Assignee: General Electric Company, Schenectady, NY (US)

( * ) Notice: Subject to any disclaimer, the term of this patent is extended or adjusted under 35 U.S.C. 154(b) by 0 days.

(21) Appl. No.: 10/837,735

(22) Filed: May 3, 2004

(65) Prior Publication Data

US 2004/0203312 A1 Oct. 14, 2004

Related U.S. Application Data

(62) Division of application No. 09/633,527, filed on Aug. 7, 2000, now Pat. No. 6,747,406.

(51) Int. Cl.[7] .................... H01J 63/04; H01L 33/00
(52) U.S. Cl. .................... 445/25; 445/24; 313/511; 313/512
(58) Field of Search .................... 445/24, 25; 313/511, 313/512, 257, 100; 257/99, 100; 427/66

(56) References Cited

U.S. PATENT DOCUMENTS

| | | | |
|---|---|---|---|
| 4,119,745 A | * 10/1978 | Smith | 427/66 |
| 4,203,792 A | * 5/1980 | Thompson | 438/25 |
| 4,513,023 A | * 4/1985 | Wary | 427/511 |
| 5,757,013 A | 5/1998 | Groger et al. | |
| 5,787,104 A | 7/1998 | Kamiyama et al. | |
| 5,895,225 A | 4/1999 | Kidoguchi et al. | |
| 5,998,925 A | * 12/1999 | Shimizu et al. | 313/503 |
| 6,046,539 A | * 4/2000 | Haven et al. | 313/461 |
| 6,069,444 A | 5/2000 | Krafcik et al. | |
| 6,069,867 A | 5/2000 | Ikegame | |
| 6,127,074 A | * 10/2000 | You et al. | 430/28 |
| 6,252,254 B1 | * 6/2001 | Soules et al. | 257/89 |
| 6,635,363 B1 | * 10/2003 | Duclos et al. | 428/690 |
| 6,642,652 B2 | * 11/2003 | Collins et al. | 313/512 |
| 6,650,044 B1 | * 11/2003 | Lowery | 313/502 |
| 6,747,406 B1 | * 6/2004 | Bortscheller et al. | 313/512 |

* cited by examiner

*Primary Examiner*—Joseph Williams
*Assistant Examiner*—Dalei Dong
(74) *Attorney, Agent, or Firm*—Fay, Sharpe, Fagan, Minnich & McKee, LLP

(57) ABSTRACT

A light source (10) includes a light emitting component (32), such as a UV/blue light emitting diode or laser diode coated with a layer (60) of a phosphor material (64). The phosphor material converts a portion of the light emitted by the light emitting component to light of a longer wavelength, such as yellow light. The thickness d of the layer varies across the light emitting component in relation to the intensity of light emitted by the light emitting component. This maintains a uniform color of the emission from the light source while minimizing the loss in light intensity (brightness) due to the presence of the phosphor.

17 Claims, 4 Drawing Sheets

LED CROSS-LINKABLE PHOSPHOR COATING

This application claims the benefit of application Ser. No. 09/633,527, filed Aug. 7, 2000, now U.S. Pat. No. 6,747,406, the disclosure of which is incorporated herein in its entirety, by reference.

BACKGROUND OF THE INVENTION

This invention relates to a light emitting device comprising a light emitting diode or laser diode (LED) and an excitable phosphor, which surrounds the LED chip. The phosphor is contained within a light transmissive medium of variable thickness for a more uniform emission of the light output. The invention finds particular application in combination with a UV/Blue LED and a phosphor or blend of phosphors, for converting LED-generated ultraviolet (UV) and/or blue light into white light for general illumination purposes. It should be appreciated, however, that the invention is also suitable to the conversion of light from other light sources to light of a different wavelength.

The advent of GaN-based epitaxial structures has lead to the development of UV and/or blue ("UV/blue") light emitting devices, including light emitting diodes and lasers (both are generally referred to herein as LED's). By combination of the light emitting device with one or more phosphors, generation of visible light (e.g., red, blue, or white light) is achieved. The phosphor transforms a portion of the UV and/or blue light into light of longer wavelength, for example, by employing a UV/blue absorbing, yellow emitting phosphor, such as $Y_3Al_5O_{12}$—$Ce^{3+}$ (commonly referred to as YAG-Ce).

To form white light, the YAG-Ce phosphor converts a portion of the LED UV/blue light into yellow light. This produces a white field with a color rendering index (CRI) of about 77 and a color temperature ranging from about 6000 K to 8000 K. For some applications, conversion of UV/blue light from an LED to visible light using phosphors may be more attractive than the direct application of visible LEDs comprising combined LEDs emitting in several color bands to yield collectively a white light. Such UV/blue LED phosphor devices, for example, offer the opportunity to encompass a wider color range, which is important for display as well as for illumination applications. Similarly, the color of the light can be modified by combining two or more phosphors.

LED's, including the blue and UV emitting types, comprise a generally rectangular chip or die, formed from a semiconductor material, that radiates in a non-uniform fashion. In particular, the intensity of light generated at some regions of the front surface of the attached die (e.g., at the bond pads) is only a small fraction of the light emitted from the translucent sides and the remainder of the front (or back, in the case of a flip chip). When the die is coated with a layer of phosphor, the non-uniformity in the radiation emitted by the LED results in non-uniform excitation of the phosphor and may cause non non-uniformity in the color and/or intensity of the light emitted by the device.

With phosphor coated visible LED's, too thick of a phosphor coating over the less light intense areas reduces the light output and shifts the color of the output in those regions by not allowing enough of the LED wavelength emission to pass through to balance the color from the phosphor emission. This results in an overall emission which is not "white," since it is dominated by the phosphor emission color.

Alternatively, too thin of a coating over the more intense areas of the LED allows too much of the LED wavelength emission to pass through, resulting in light that is not white, since it is dominated by the LED color. In the case of a UV-emitting LED, harmful UV rays may be emitted from the lamp, or must be stopped by a UV-reflective coating on the lens, if the phosphor layer is too thin to absorb them.

Thus, a uniform coating may be ideal for some areas of the die, but too thick or too thin for others, resulting in non-uniform color emission as well as reduced efficiency.

Another problem with LED emission is that the die attach materials tend to block light emitted from the sides of the LED. These materials are used to attach the LED to a cup or other support and to provide thermal transfer away from the die to a heat sink. The typical die attach materials used are silver epoxy or ceramic filled epoxy, which are thermally cured. During the die attach process, there is an inherent wicking of the attach material up the sides of the die. It is difficult to apply a sufficient amount of the die attach material to bond the device in place and provide thermal conduction without some wicking taking place. Particularly in the case of LED's with sapphire substrates, this causes significant degradation in the light output, since a large proportion of the light output from such LED's is through the sides.

The present invention provides a new and improved light source, and method of formation, which overcomes the above-referenced problems and others.

SUMMARY OF THE INVENTION

In an exemplary embodiment of the present invention, a light source is provided. The light source includes a light emitting component, such as a light emitting diode or laser diode, which emits light and a phosphor-containing material. The phosphor material is positioned to receive light emitted by the light emitting component and convert a portion of the light to light of a different wavelength. The phosphor containing material has a thickness which varies in relation to an intensity of the light emitted by the light emitting component.

As used herein, the term light is not limited to visible light but is intended to encompass all suitable regions of the electromagnetic spectrum.

In another exemplary embodiment of the present invention, a light source is provided. The light source includes a light emitting component which emits light and a phosphor-containing material positioned to receive light emitted by the light emitting component. The phosphor-containing material converts a portion of the light to light of a different wavelength. The phosphor-containing material has a thickness which is greater in regions where the intensity of the light emitted by the light emitting component is higher and lesser in regions where the intensity of the light emitted by the light emitting component is lower. This improves the uniformity of the color emitted by the light source.

In another exemplary embodiment of the present invention, a method of improving color distribution of a light source emission is provided. The method includes forming a layer of a phosphor-containing curable material on a light emitting component and energizing the light emitting component for a sufficient period of time to cure a portion of the curable material. The remaining uncured curable material is then removed.

One advantage of the present invention is that light is produced with a relatively uniform color over a wide range of viewing angles.

Another advantage of the present invention is that the intensity of the converted light output is increased, due to the optimization of the phosphor layer thickness.

Other advantages of the present invention derive from the use of a UV-curable material to bond the die to a support structure.

Another advantage of the present invention is that the phosphor may be thermally insulated from high temperatures generated near the LED junction.

Still further advantages of the present invention will become apparent to those of ordinary skill in the art upon reading and understanding the following detailed description of the preferred embodiments.

DESCRIPTION OF THE PREFERRED EMBODIMENTS

A phosphor coating with self adjusting variable thickness is made by combining at least one phosphor with a material which is curable by light of a selected wavelength. The phosphor-impregnated curable material is applied to a die (laser diode or light emitting diode). Light from the die is then used to cure the material to a thickness that varies across the die in relation to the intensity of the light emitted.

Figure 1:
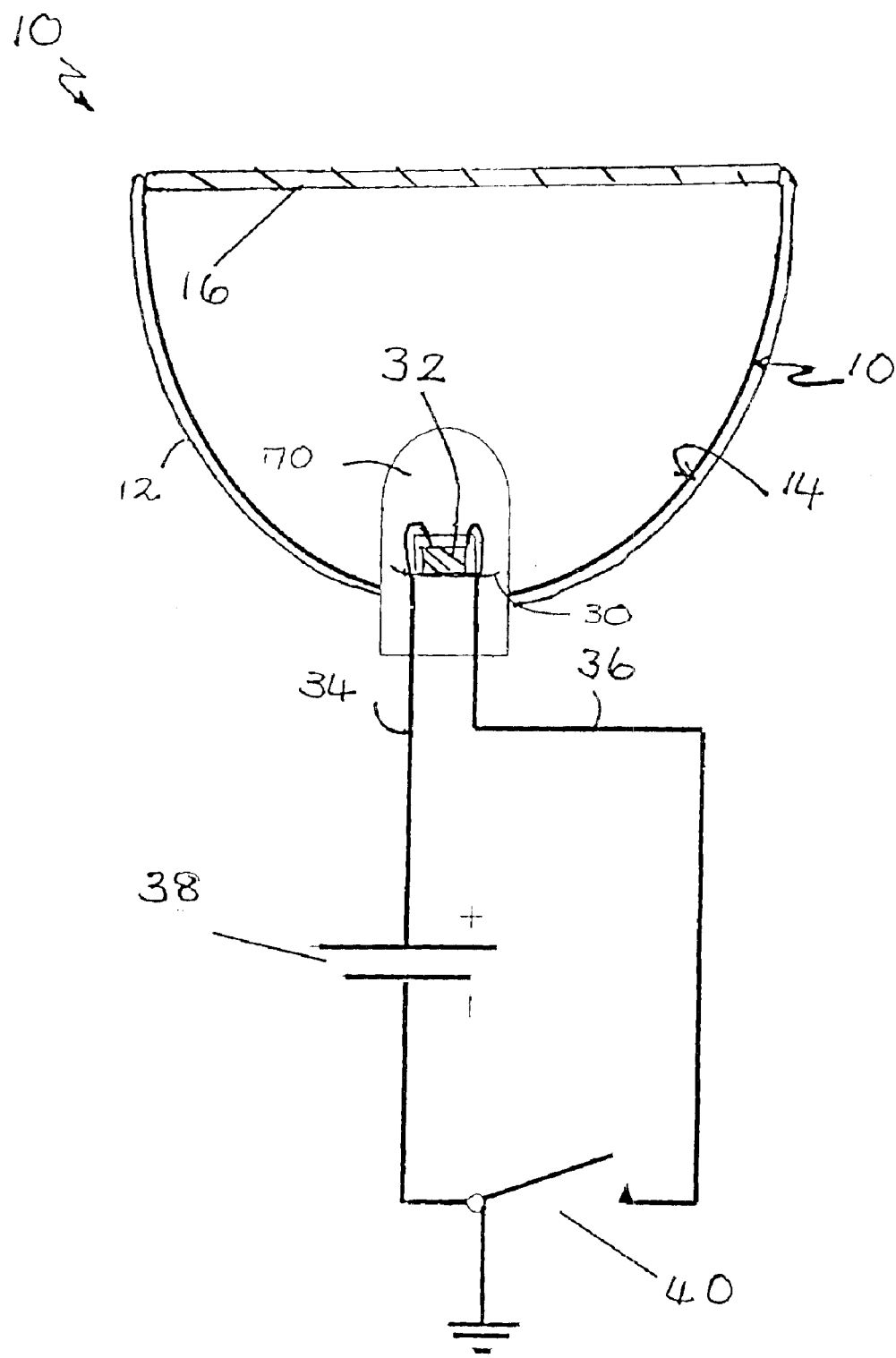
FIG. 1 is a schematic sectional view of a lamp employing an LED coated with a UV-curable medium containing a phosphor according to the present invention.

With reference to FIG. 1, a light source, such as a lamp 10, includes a cup-shaped reflector housing 12, which is coated on its interior surface with a reflective coating 14 capable of reflecting light in the UV and visible range of the electromagnetic spectrum. As used herein, the term "light" encompasses radiation in the UV and IR regions of the electromagnetic spectrum in addition to light in the visible region of the spectrum—i.e., all radiation emitted by or generated within the light source.

The reflector housing 12 may have a variety of configurations for reflecting light as a beam, or for providing more diffuse light. A light transmissive window 16 covers an open end of the housing. The window may be in the form of a lens, for focussing light emitted from the housing, or a sheet of light transmissive material, such as glass, plastic, or the like. Optionally, the window 16 or other portion of the device includes a UV filter which reflects unconverted UV light back into the reflector housing.

A reflective cup 30, capable of reflecting light in the UV and/or visible range of the electromagnetic spectrum, is positioned at the base of the housing 12. A light-emitting component 32, such as a light emitting diode or laser diode (both laser diodes and light emitting diodes are referred to collectively herein as "LEDs" or "dies"), or a bank of LEDs, is received within the cup. Electrical leads 34, 36 connect the light-emitting component 32 to a source of power 38, such as a battery, or other electrical power source. On application of a voltage (e.g., by operating a switch 40), light is emitted by the LED 32 into the housing and may be reflected from the reflective coating 14 and/or the cup 30.

Figure 2:
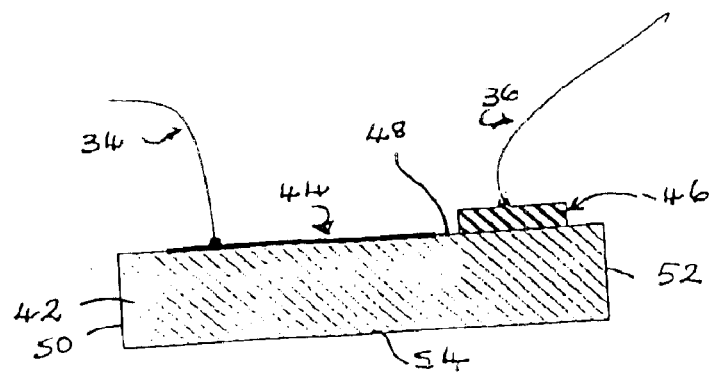
FIG. 2 is an enlarged side view of the LED and electrodes of FIG. 1 prior to formation of the phosphor coating.

With reference now to FIG. 2, the light emitting component includes a die or chip 42 comprising a plurality of layers of semiconductor material. Electrical leads 34, 36 are connected with the chip at bond pads or electrodes 44, 46. The bond pads are preferably light transmissive, although there is invariably some reduction in the intensity of the emission from the LED at the bond pads. In the embodiment of FIG. 2, one of the electrodes 44 is transmissive, while the other electrode 46 is opaque. Although the electrodes are shown as making a connection with a front surface 48 of the chip, each of the electrodes is connected with a different layer of the semiconductor material, and either or both electrodes may be located on the front surface, sides 50, 52, or back surface 54 of the chip.

Figure 4:
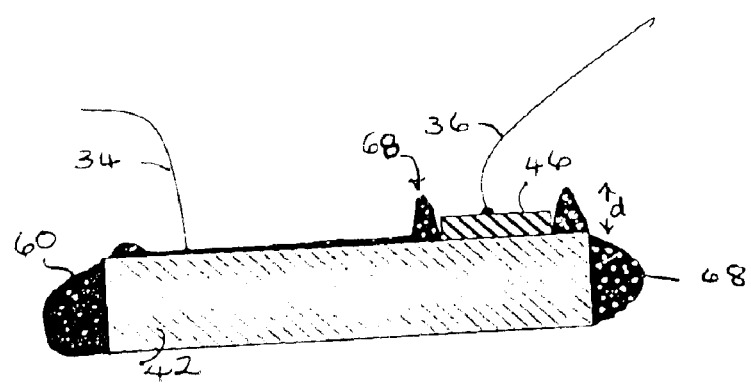
FIG. 4 is a side view of the LED chip of FIG. 3 after curing the phosphor-containing light curable medium and removal of excess medium.
Figure 5:
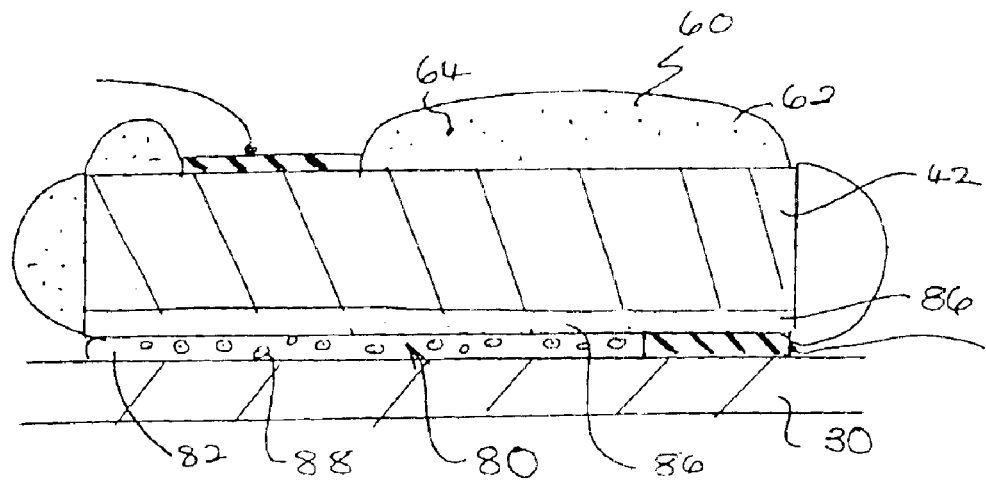
FIG. 5 is a side view of an alternative embodiment of a light source according to the present invention.

With reference now to FIGS. 4 and 5, a variable thickness layer 60 surrounds the UV/blue radiating sides of the chip, i.e., the front 48 and four sides 50, 52 of the chip. The layer 60 comprises a UV/blue transmissive material 62, which is formed from a light curable medium (such as a UV/blue curable medium), mixed with a phosphor material 64. In the embodiment of FIG. 4, the base of the chip is attached to an opaque header and is not used for transmission of light, although embodiments in which the base of the chip is also coated with a layer similar to the layer 60 are also contemplated.

The phosphor material 64 is dispersed substantially homogeneously through the layer 60, such that the proportion of light converted by the phosphor to light of a different wavelength is substantially proportional to the thickness d of the layer 60. The thickness d of the layer 60 is not uniform, but varies across the surfaces of the die. Where the intensity of light emitted from the die is greater (in the embodiment of FIGS. 2–4, this is adjacent the front surface 48, in areas 68 away from the electrodes, and adjacent the midpoint of the sides), the thickness of the layer 60 is also greater. Where the intensity of the light emitted is low, such as over the transmissive electrode 44, or absent, such as over the opaque electrode 46, the phosphor containing layer 60 is correspondingly thinner, or absent altogether. Specifically, the thickness d of any selected region of the layer 60 varies in relation to (e.g., is proportional to) the intensity of the light passing through that region of the layer. Thus, the thickness d varies according to the intensity of the LED emission at the particular phosphor position. It is generally desirable to achieve white light—i.e., a balance of LED and phosphor emissions. However, light which is relatively more towards the color of the phosphor emission can be achieved in some instances by adding to the thickness of the layer by a fixed additional thickness. Or, light which is relatively more towards the color of the LED emission can be achieved by reducing the thickness of the layer, in a similar manner. Other ways of adjusting the overall color are also contemplated, such as changing the LED drive current or operating in a pulse mode, which may be at a higher voltage than that used during normal lamp operation, during curing of the phosphor layer. The average thickness of the self adjusting phosphor layer 60 can also be controlled by adjusting the exposure time to the LED die during curing. Alternatively, the concentration of the phosphor 64 in the medium 62 may be adjusted to achieve the desired color of the light.

By having a varying thickness layer, the thickness of the phosphor is optimized over the entire surface, i.e., it is not too thick (which could result in unnecessary absorption of the light by the phosphor and loss in lamp brightness), or too thin (which could result in less than desired conversion of LED emission and, in the case of a UV LED, emission of undesirable UV light).

The phosphor-containing layer 60 converts a portion of the emitted light from the chip 42 to a different wavelength, in the visible region of the spectrum. In the case of a blue/UV LED, the phosphor typically converts the light from the LED to a longer wavelength, yellow color. While the light source will be described with particular reference to a blue/UV LED, it should be appreciated that LEDs emitting in different regions of the electromagnetic spectrum are also contemplated.

With reference once more to FIG. 1, the LED 32, comprising chip 42, and the phosphor-containing layer 60, are preferably protected by a resin mold 70, which may be formed from a clear epoxy, or other transparent encapsulation material. The mold transmits the light emitted from the light emitting component(s). Preferred epoxy encapsulation materials include UV/blue light resistant epoxies, such as cycloaliphatic epoxies. As shown in FIG. 1, the resin mold also encapsulates the phosphor-containing medium 60 and the die. This allows the resin material to act effectively as a lens, if desired, focussing the scattered and converted light.

Figure 3:
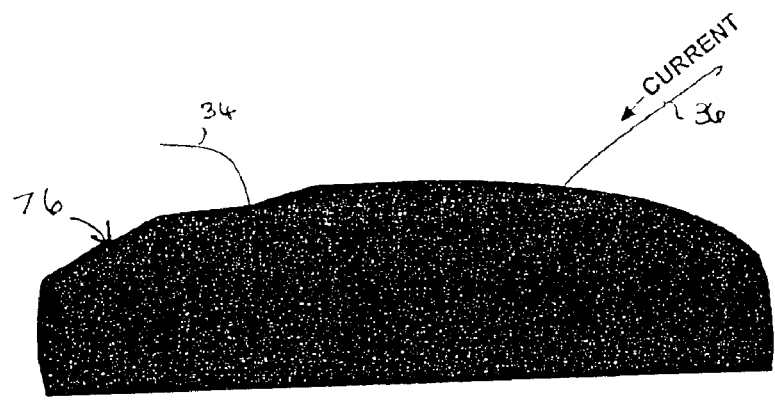
FIG. 3 is side view of the LED and electrodes of FIG. 2 coated with a phosphor-containing, light curable medium during formation of the phosphor coating.

The light curable medium 60 is formed from a material 76 which is curable by light emitted by the LED chip 42, i.e., it is converted from a liquid or viscous fluid to a solid under the application of radiation (see FIG. 3). If the chip is a UV/blue chip, the wavelength at which the medium is cured is in the blue and/or UV region of the electromagnetic spectrum (i.e., within the wavelength ranges(s) of the radiation emitted by the LED chip). For LED's which emit a different wavelength radiation, such as in the red/IR region of the electromagnetic spectrum, a curable medium which is cured by these wavelengths is preferably used. Once cured, the light curable medium is preferably itself transmissive to light emitted by the LED.

A variety of materials may be used for forming the UV/blue (or other selected wavelength(s)) curable medium 76. For example, UV/blue curable epoxies or polyvinyl alcohol (PVA) may be used. Octacat™, available from General Electric's Silicone products, Waterford, N.Y., or FC530, available from 3M, are non-limiting examples of such UV/blue curable materials. Dental adhesives, which are activated by UV/blue light make particularly good crosslinkable materials. An example of such an adhesive is a blue-cured dental adhesive sold under the trade name Dentsply's Prime & Bond, by Caulk, Inc.

Optionally, a curable material may be combined with a chromatic salt, which forms a complex with the curable material on exposure to a selected radiation. Examples of chromatic salts for forming UV-sensitive complexes with PVA are discussed in "Water Soluble Gums and Resins," Chapter 20, by R. L. Davidson, McGraw Hill, 1980.

Under irradiation by UV and/or blue light, the curable medium is caused to crosslink, or otherwise form a solid, cured material.

The phosphor material 64 (see FIG. 5) may include more than one phosphor, such as two or more different phosphors (fluorescent materials). When the phosphor material includes two or more different phosphors, these are preferably mixed together in the layer 60. Alternatively, the different phosphors are layered in the coating.

The phosphors that comprise the phosphor material 64 are substances which are capable of absorbing a part of the light emitted by the LED die 42 and emitting light of a wavelength different from that of the absorbed light. Preferably, the phosphors convert a portion of the light to light in the visible region of the spectrum. In a UV/blue LED, the phosphor is preferably used to convert a majority the UV portion of the light to useful light in the visible region of the spectrum, and may also convert a portion of the blue light to longer wavelengths. The light output from the lamp may thus be a combination of two or more wavelengths, namely, unconverted blue light from the LED and light of at least one other color, such as yellow light, which has been converted by the phosphor(s). It is also contemplated that the light emitted by one or more phosphors is used to excite another phosphor(s).

The color of the light emitted by the lamp 10 of FIG. 1 is dependent on the selected mixture of phosphors in the phosphor mixture, on the emission spectrum of the LED 32, on the thickness of the phosphor containing layer, and on the concentration of the phosphor material in the layer. By selection of the type of LED used and the phosphor(s) in the phosphor material, light of a preselected color, such as white light, can be achieved. The visible light passes through the window 16 and/or is focussed by the lens.

In another embodiment, the phosphor layer is built up as a series of layers, each layer formed by depositing a layer 76 of light curable material and energizing the die to cure a portion of the light curable material. The remaining uncured material may then be removed prior to application of a subsequent layer. Each layer may be formed from the same light curable material, or may be different in composition. For example, the type or concentration of the phosphors may be varied. Alternatively, or additionally, the layers may be cured in different ways, for example, by changing the intensity of the LED light, or the exposure time.

Light emitting components 32 suited to use in the present invention include GaN-based (InAlGaN) semiconductor devices. Suitable GaN semiconductor materials for forming the light emitting components are generally represented by the general formula $In_iGa_jAl_kN$, where $0 \leq i$, $0 \leq j$, $0 \leq k$, and $i+j+k=1$. The nitride semiconductor materials may thus include materials such as InGaN and GaN, and may be doped with various impurities, for example, for improving the intensity or adjusting the color of the light emitted. Laser diodes are similarly formed from an arrangement of GaN layers. Techniques for forming LEDs and LDs are well known in the art.

GaN-based light emitting devices are capable of emitting light with high luminance. A suitable GaN-based LED device includes a substrate layer formed from a single crystal of, for example, sapphire, silicon carbide, or zinc oxide. A epitaxial buffer layer, of, for example, $n^+$ GaN is located on the substrate, followed by a sequence of epitaxial layers comprising cladding layers and active layers. Electrical contact is made between two of the layers and the corresponding voltage electrodes (through a metal or other contact layer) to connect the LED to the circuit and source of power.

The wavelength of the light emitted by an LED is dependent on the material and the configuration of the semiconductor layers employed in forming the LED. As is known in the art, the composition of the semiconductor layers and the dopants employed can be selected so as to produce an LED with an emission spectrum which closely matches the excitation (absorption) spectrum of the phosphor material 64.

While the invention is described with particular reference to UV/blue light emitting components, it should be appreciated that light emitting components which emit light of a different region in the electromagnetic spectrum may also be used. For example, a red-emitting light emitting diodes or laser diode, such as an aluminum indium gallium phosphate (AlInGaP) LED emits light in the red region of the spectrum.

A variety of phosphors may be used in the present invention to form the phosphor material. In one embodiment, a UV/blue absorbing, yellow emitting phosphor is used in combination with an LED which emits at least a portion of its light in the blue region of the spectrum. Exemplary yellow emitting phosphors include cerium activated phosphors garnet-based fluorophors containing at least one element selected from the group consisting of Y, Lu, Sc, La, Gd, and Sm and at least one element selected from Al, Ga, and In. Examples of this type of phosphor include $Y_3Al_5O_{12}:Ce^{3+}$ (commonly referred to as YAG-Ce). The yellow emitting phosphor is used to convert a portion of the light emitted by the LED to light in the yellow portion of the visible spectrum. The light emitted by the phosphor has a relatively uniform angular light distribution.

In the description of phosphors, a conventional notation is used, wherein the chemical formula for a host or matrix compound is given first, followed by a colon and the formula for an activator (an impurity that activates the host crystal to luminesce). For example, in the case of the yellow YAG emitter, $Y_3Al_5O_{12}:Ce^{3+}$, $Y_3Al_5O_{12}$ is the host and $Ce^{3+}$ is the activator.

In the case of LEDs which emit primarily in the UV region of the spectrum, a combination of phosphors, such as a red, a green and a blue phosphor can be used to form white light.

Examples of other phosphors which may be utilized in the phosphor material 64 include blue emitters, such as $BaMg_2Al_{16}O_{27}:Eu^{2+}$, or $(Ba, Sr, Ca)_5(PO_4)_3Cl:Eu^{2+}$ which convert a portion of the UV light to blue light; and red emitters, such as $Y_2O_3:Bi^{3+}$, $Eu^{2+}$, which convert a portion of the UV light to red light. Other suitable phosphors include $Y_2O_2S:Eu$ (a red emitter); and $ZnS:Cu, Ag$ (a green emitter).

In another embodiment, light from the one or more phosphors in the phosphor material 64 is used to excite one or more additional phosphors.

Where more than one phosphor is used in the phosphor material 64, the phosphors may be mixed together in a single layer 60, separately layered to form a multi-layer coating, or separated into isolated regions. Phosphors to be used in a phosphor blend in light source 10 preferably have the following attributes:

1. Light resistance. Ideally, the phosphor is one which has a good resistance to light so that its fluorescent properties are not degraded when used over an extended period of time.

2. Capability of emitting light with a high efficiency.

3. Temperature resistance, if located in the vicinity of the LED.

4. Weatherability in the operating environment of the light source.

To form the phosphor-containing layer 60, the phosphor or phosphors 64 used are mixed with the light curable medium 62 to form a curable, phosphor-containing material 76 (See FIG. 3). The die of FIG. 2 is coated with a layer of this material 76 to a thickness greater than that of the desired eventual thickness of the phosphor containing layer 60. Then the electrodes 34, 36 are connected with a source of power to energize the chip 42 (See FIG. 3). The chip emits light of its characteristic wavelength, which begins to cure the light-curable medium. The rate of cure (i.e., the thickness of the cured material after a given time) is dependent on the light emission from the adjacent portion of the chip. The electrodes, and other low transmissive regions of the chip surface act as masks, slowing, or preventing cure of the adjacent material 76. Thus, the material cures at different rates, depending on the light received.

After a selected period of time, the curing process is stopped, for example, by switching off the LED. The exposure time and/or intensity of LED emission is chosen so as to give a layer of phosphor material of varying thickness, which is appropriate to provide the desired color and/or intensity of light. The exposure time is less than that which would be required to cure the entire thickness of the material 76. The remaining, uncured material 76 is then removed, for example, by rinsing in a suitable solvent. The type of solvent which is used depends on the nature of the light-curable material. Exemplary solvents include, water, organic solvents, such as hydrocarbons, alcohols, ketones, and the like. For blue-cured dental adhesives, acetone is a convenient solvent.

After removal of the uncured material 76, the LED may be switched on again, or an outside source of UV or visible light may be used, to assure the complete cure of the coating 60. Or a heat final cure may be used if the curing agent in the medium 62 is responsive to both processes.

With reference now to FIG. 5, in one embodiment the die is bonded to the LED cup 30, or other suitable surface, with a die attach material 80 comprising a UV curable material 82. Suitable materials 82 include epoxies and other UV/light curable materials, such as acrylates, silicones, polyurethanes, and those described above. The die attach material 82 provides a physical bond between the cup 30 and the substrate 86 of the die and provides for thermal transfer between the die and a heat sink (not shown). The die attach material can be made to reflect or absorb light by the use of appropriate fillers and dyes in combination with the epoxy or other visible activation materials. For example, fillers may be used to optimize thermal, light scattering, and/or curing properties.

In one preferred embodiment, the filler provides the die attach material with a refractive index which matches that of the sapphire 86 or other substrate of the die and thereby maintains total internal reflection (TIR). Suitable materials for improving thermal transfer include diamond particulate. Phosphors, such as the YAG-Ce phosphor described above, may be used alone or in combination with other fillers. For example, the die attach material may be combined with one or more phosphors to provide a light activation in the visible region. In such cases, the die attach material is light-transmissive and the cup 30 acts as a reflector to reflect light emitted from the base of the die through the die attach material 80. The die attach material 80 can be cured in the same curing process as the phosphor-containing material 60, or cured separately.

In another embodiment for forming the die attach, a polymer mask, such as a thermal epoxy, is applied to the center section of the die and heat cured, leaving a gap at the edges. This provides enough of a die attach 80 to allow wire bonds to be applied to provide the electrical connections. Combinations of UV/visible-curing and heat curing may alternatively be used. For example, a UV or visible source may be used to position the die, followed by heat application to completely cure the die attach.

Flip chip embodiments are also contemplated. In these LEDs, the electrical connections are generally made by soldering the electrodes to the chip. The light is sent out of the chip 42 primarily through the back 54 and sides 50, 52.

Figure 6:
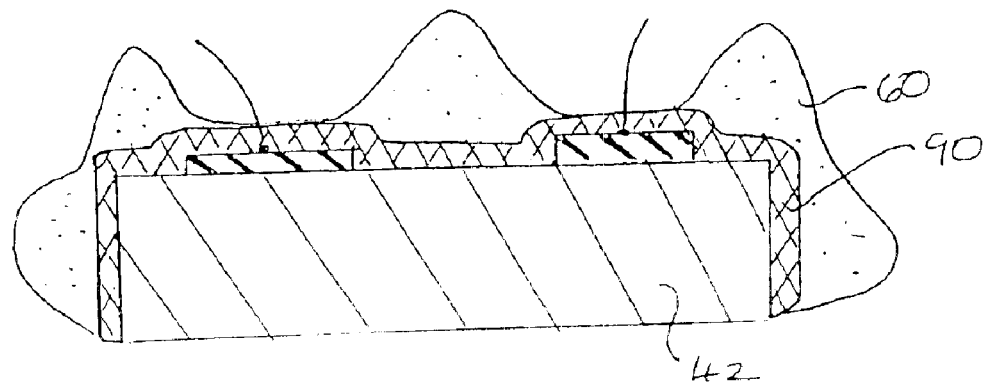
FIG. 6 is a side view of a second alternative embodiment of a light source according to the present invention.

With reference to FIG. 6, an intermediate layer 90 may be interposed between the chip and the phosphor-containing layer 60. The intermediate layer may be used to reduce thermal transfer to the phosphor, which tends to degrade the phosphor and reduce the active life. The intermediate layer is formed from a light transmissive material, such as an epoxy or other crosslinkable material. Optionally, a UV/visible-curable material is used, such as the UV-curable materials described above.

Figure 7:
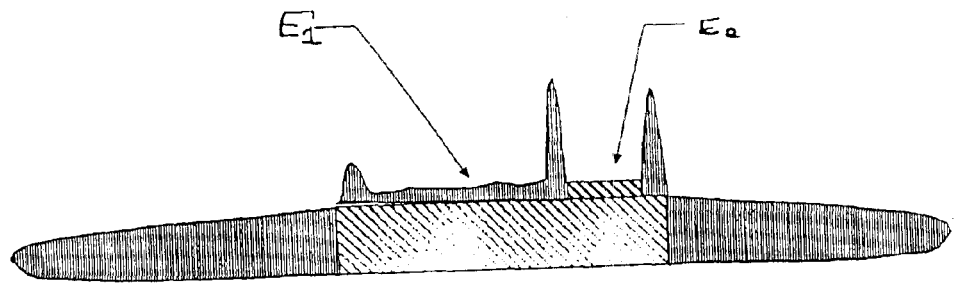
FIG. 7 is a schematic view of an LED chip without a phosphor coating showing the intensity of the light emitted from the LED (vertical hatching indicates UV/blue emission)
Figure 8:
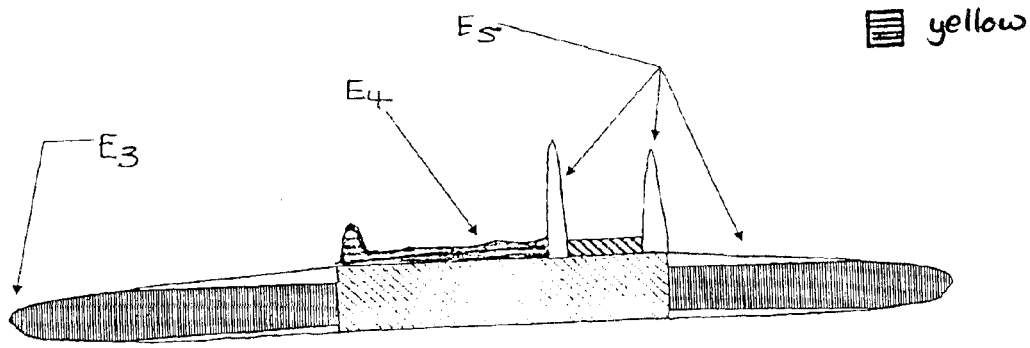
FIG. 8 is a schematic view of an LED chip with a phosphor coating of uniform thickness, showing the intensity of the light emitted from the LED (vertical hatching indicates an overly "blue" emission, no hatching indicates "white" emission, horizontal hatching indicates an overly "yellow" emission)
Figure 9:
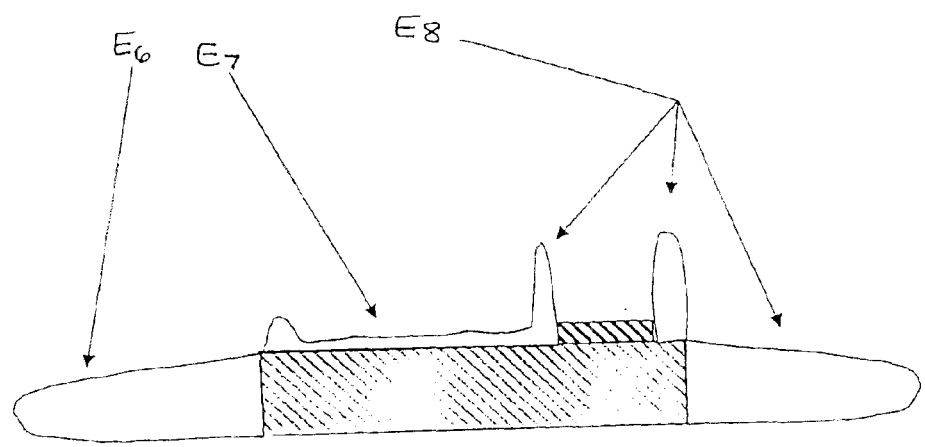
FIG. 9 is a schematic view of an LED chip with a phosphor coating of variable thickness, according to the present invention showing the intensity of the light emitted from the LED (no hatching indicates "white" emission)

With reference now to FIGS. 7–9, the emission patterns of three LED arrangements are predicted. The height of the peaks indicates the intensity of the expected emission, and the shading indicating the color of the emission. The emission from the LED chip is shown as it would be if the chip were bonded at its base to an opaque header—thus, there is no emission from the base. FIG. 7 shows the predicted emission from a gallium nitride LED die without a phosphor. All of the emission is in the blue/UV range of the spectrum (vertical hatching). The emission $E_1$ in the region of the transparent electrode is reduced and is absent at the region $E_2$ of the opaque electrode.

FIG. 8 predicts the emission from a similar die, but which has been coated with a phosphor-containing layer of uniform thickness. In the example, the phosphor is a YAG-Ce phosphor, which converts blue/UV to yellow light. The color of the light around the die is not uniform, some regions $E_3$, appearing too blue where the phosphor layer is too thin, when compared with the light emitted by the die. Other regions $E_4$ appear too yellow. There, the phosphor layer is too thick, compared with the LED's light emission, so that all, or too much of the UV/blue light emitted is converted by the phosphor to yellow light. Only a relatively small proportion of the light emitted from the die is of the desired white color balance, at $E_5$, where the phosphor layer has the correct thickness for the intensity of the emitted LED light.

FIG. 9 predicts the emission from a similar die, but which has been coated with a YAG-Ce containing layer of varying thickness, prepared in the manner described above. The emission at $E_6$, $E_7$, and $E_8$ is all of the desired white color, even though the intensity of the light output varies in the different regions.

Optionally, a light scattering material is used in combination with the phosphor-containing layer 60. The light scattering material may be mixed with the curable medium 76, formed as a layer intermediate the LED chip and the layer 60, or positioned elsewhere in the lamp. The light emitted by the LED impinges on the light scattering material and is scattered, such that the light exiting the scattering material is distributed in a more uniform angular distribution, i.e., with an emission intensity which is relatively even over a wide range of angles for a relatively uniform angular distribution. This improves the light intensity distribution, so that the light source emits light with a more even brightness.

The light scattering material reflects and/or refracts the light impinging upon it. To scatter light effectively, the light scattering material preferably has a high index of refraction, preferably greater than about 1.2, and more preferably, greater than about 1.46, The light scattering material is preferably also one which does not appreciably absorb the light.

Scattering efficiency is also influenced by particle size and particle shape. The particle size of the light scattering material is preferably on the order of the wavelength of the light to be scattered. For UV/blue light, a mean particle size of about 0.3 micrometers is thus preferred. Preferably, the mean particle size is less than about ten times the wavelength of light, i.e. for UV/blue light, the mean particle size is preferably less than about 3 micrometers. Preferably, the mean particle size is more than about one tenth the wavelength of light, i.e. for UV/blue light, the mean particle size is preferably more than about 0.03 micrometers. With regard to particle shape, particles with random and angular surfaces are preferred.

Suitable light scattering materials include fine particulate materials, such as glass, quartz, and oxides of Ti, Al, and rare earth elements, such as Gd and Y. Preferred materials are $TiO_2$ and $Al_2O_3$. An exemplary light scattering material is Dupont R960™ $TiO_2$. This material is a fine powder, having a mean particle size of 0.3 micrometers and comprises $TiO_2$ coated with an aluminosilicate glass. This material effectively scatters the wavelengths of light primarily emitted by a UV/blue GaN-based LED without appreciable absorption of the light.

Alternatively, light scattering may be introduced to the phosphor containing layer by incorporating fine air bubbles into the light-curable material prior to or during curing.

While the light source has been described in terms of a reflector housing, other arrangements which do not rely on a reflective surface are also contemplated. In one alternative embodiment, light emitted by the LED 42 and phosphor material 60 is transported by light pipes.

The invention has been described with reference to the preferred embodiment. Obviously, modifications and alterations will occur to others upon reading and understanding the preceding, detailed description. It is intended that the invention be construed as including all such modifications and alterations insofar as they come within the scope of the appended claims or the equivalents thereof.

What is claimed is:

1. A method of improving color distribution of a light source emission, the method comprising:

forming a layer of a phosphor-containing curable material on a light emitting component;

energizing the light emitting component for a sufficient period of time to cure a portion of the curable material; and removing remaining uncured curable material.

2. The method of claim 1, further comprising, prior to the step of forming a layer of a phosphor-containing curable material on the light emitting component:

forming a layer of a light-transmissive material which is free of phosphor intermediate the light emitting component and the layer of phosphor-containing curable material.

3. The method of claim 1, further comprising:
   attaching the light emitting component to a support member, including:
      coating a back of the light emitting component with a layer of a curable bonding material.

4. The method of claim 3, wherein the curable bonding material is cured during the step of energizing the light emitting component.

5. A light source formed by the method of claim 1.

6. The method of claim 1, wherein the light emitting component is selected from the group consisting of light emitting diodes and laser diodes.

7. The method of claim 1, wherein the phosphor-containing curable material is formed from a material which includes:
   a phosphor; and
   a light-curable material which is curable by light emitted by the light emitting component.

8. The method of claim 7, wherein the light emitting component emits light in at least one of the blue region and the UV region of the electromagnetic spectrum and the light-curable material is a blue or UV-curable material.

9. The method of claim 8, wherein the blue or UV-curable material is a dental adhesive.

10. The method of claim 7, wherein the phosphor is a yellow-emitting phosphor.

11. The method of claim 1, wherein the step of forming a layer of a phosphor-containing curable material on a light emitting component phosphor-containing material includes surrounding at least a front and side edges of the light emitting component with the phosphor-containing curable material.

12. The method of claim 1, wherein the step of removing remaining uncured curable material results in a phosphor-containing material having a thickness which varies in proportion to the intensity of the light emitted by the light emitting component at the applied voltage, whereby the uniformity of color emission is improved as compared with a uniform thickness layer.

13. A method of forming a light source, the method comprising:
   applying a phosphor-containing curable material to a light emitting component;
   energizing the light emitting component for a sufficient period of time to cure a portion of the phosphor-containing curable material; and
   after the step of energizing the light emitting material, removing uncured curable material to provide a cured material with a thickness which varies across the light emitting component.

14. The method of claim 13, further comprising, prior to the step of applying the phosphor-containing curable material:
   forming a layer of a light transmissive material intermediate the light emitting component and the phosphor-containing curable material.

15. The method of claim 13, wherein the step of removing remaining uncured curable material includes rinsing the uncured material with a solvent.

16. The method of claim 13, further including forming a layer of a light scattering material on the light emitting component.

17. The method of claim 16, wherein the layer of light scattering material is formed intermediate the light emitting component and the cured material.

* * * * *